(12) United States Patent
Arnold et al.

(10) Patent No.: US 6,744,274 B1
(45) Date of Patent: Jun. 1, 2004

(54) PROGRAMMABLE LOGIC CORE ADAPTER

(75) Inventors: Jeffrey M. Arnold, San Diego, CA (US); Rafael C. Camarota, Sunnyvale, CA (US); Joseph H. Hassoun, Los Gatos, CA (US); Charle' R. Rupp, Morgan Hill, CA (US)

(73) Assignee: Stretch, Inc., Mountain View, CA (US)

( * ) Notice: Subject to any disclaimer, the term of this patent is extended or adjusted under 35 U.S.C. 154(b) by 0 days.

(21) Appl. No.: 10/206,872

(22) Filed: Jul. 26, 2002

Related U.S. Application Data

(60) Provisional application No. 60/311,210, filed on Aug. 9, 2001.

(51) Int. Cl.[7] ............................................. H03K 19/177
(52) U.S. Cl. ............................. 326/16; 326/39; 326/40; 326/41; 714/724
(58) Field of Search .................. 326/16, 38–41; 714/724, 726

(56) References Cited

U.S. PATENT DOCUMENTS

| | | | | |
|---|---|---|---|---|
| 5,878,051 A | * | 3/1999 | Sharma et al. | 714/724 |
| 6,191,603 B1 | * | 2/2001 | Muradali et al. | 324/765 |
| 6,408,412 B1 | * | 6/2002 | Rajsuman | 714/724 |
| 6,492,833 B1 | * | 12/2002 | Asson et al. | 326/41 |
| 6,577,158 B2 | * | 6/2003 | Gupta | 326/39 |

* cited by examiner

Primary Examiner—Vibol Tan
(74) Attorney, Agent, or Firm—Carr & Ferrell LLP

(57) ABSTRACT

A programmable logic core (PLC) can be integrated into custom ICS such as ASICs and SOCs. An example PLC for integration into a custom IC includes a Multi Scale Array (MSA) that consists of an array of configurable ALUs, an Application Circuit Interface (ACI) that provides signal interface between the MSA and application circuitry, and a PLC Adapter that initiates and loads the PLC configuration data and interfaces.

23 Claims, 10 Drawing Sheets

PROGRAMMABLE LOGIC CORE ADAPTER

CROSS-REFERENCE TO RELATED APPLICATIONS

This application claims the benefit of Provisional application Ser. No. 60/311,210 filed Aug. 9, 2001.

The present application is related to U.S. patent application Ser. No. 60/265,303, filed Jan. 30, 2001, commonly owned by the assignee of the present invention, the contents of which are incorporated herein by reference.

FIELD OF THE INVENTION

The present invention relates generally to programmable logic elements, and in particular, to structures and techniques for allowing programmable logic to be embedded into customized integrated circuits such as Application Specific Integrated Circuits (ASICs) and Systems On a Chip (SOP).

BACKGROUND OF THE INVENTION

Observers of the semiconductor industry cannot help but be impressed by the relentless advance of technology. As manufacturing technologies improve, and provide continuously lower cost, increased density parts, design teams in their intensely competitive markets strive to take advantage of the technology with ever increasingly complex devices. In devices as common as cell phone handsets or camcorders it is becoming typical to see microprocessors, DSPs, and major blocks of functionality all on the same device. About the only technology that is yet to be integrated in these multi-million gate, system-chip developments is reprogrammable logic. This is quickly becoming the next target for system-chip integration.

Embedded programmable logic offers the promise of reducing project schedules by implementing high-risk design blocks so that during chip bringup, designs can be quickly re-programmed and modified without the long, costly process of redesigning new versions of silicon. Embedded programmable logic also enables field upgrades of complex algorithms or of blocks implementing protocols for evolving standards. As process geometries continue to shrink and engineering, mask and prototype silicon costs go up, embedded reprogrammable logic will enable multiple product versions to be built from a single die, leveraging those costs over multiple products.

The integration of reprogrammable logic into system chips, however, faces many technical hurdles and requires novel application of tools and systems. Reprogrammable logic by its very nature must be uniquely handled at each stage of the designing process. The right set of models and data must be available for each step from synthesis, through layout, to full chip timing analysis and simulation. Some of the key requirements for embedded programmable logic include the following: scalable programmable gate capacity and I/O bandwidth with support for implementing multiple programmable blocks on a single chip; silicon-efficient support for both control and datapath functions; in-field reprogrammability; standard CMOS process and design that is easily portable to multiple foundries; synthesizable models of the test and programming interfaces; complete Built-in Self-Test capability and support for integration within overall ASIC test methodology; support for the synthesis, simulation, timing analysis and physical design tools of the leading ASIC EDA vendors; architecture-specific synthesis libraries; accurate timing models and an effective methodology for achieving timing closure within the context of the entire chip; and frame layouts with support for ASIC power and feed-thru routing methodologies.

Co-pending U.S. application Ser. No. 09/475,400 dramatically advances the state of the art of programmable logic by introducing the concept of the "Multi-Scale Array" (MSA). Programmable Logic Cores (PLCs) based on this high-speed configurable logic structure enable the development of a new class of complex cell-based ASICs and configurable SOCs. SOC/ASIC designs incorporating these PLCs offer the best of both FPGA and ASIC worlds by combining the flexibility of FPGAs with the price and performance advantages of cell based ASICs.

It remains desirable for structures and methodologies that enable system chip designers to embed programmable logic cores (PLCS) into an overall design while not introducing additional problems, thus enabling design teams to reduce project risk by placing the high-risk parts of their designs in programmable logic. Particularly where there is a risk of changing standards, such as in communications, field reprogrammability offers the options of accelerating development programs, early release to production and low-cost, low-risk field upgrades of products.

SUMMARY OF THE INVENTION

The present invention relates to programmable logic devices. A programmable logic core (PLC) in accordance with the invention can be integrated into custom ICs such as ASICs and SOCs. An example PLC for integration into a custom IC includes a programmable logic array, an application circuit interface (ACI) that provides signal interface between the programmable logic array and application circuitry, and a PLC adapter that initiates and loads the configuration data for the programmable logic array and interfaces. In accordance with one aspect of the invention, multiple such PLCs can be integrated in a single custom IC.

According to an aspect of the invention, the PLC adapter provides both a built-in self-test controller for manufacturing test of the programmable logic array, as well as both initial and runtime verification of the configuration data stream to the programmable logic array. The configuration data stream can come from a configuration data source such as a serial PROM, or it can be a reconfiguration stream from an on-chip or off-chip processor. The PLC adapter further provides the ability to start, stop and single-step the system clock to the programmable logic array to allow for debugging, as well as to set breakpoints for issuing interrupts to a monitoring processor. According to a further aspect of the invention, the PLC adapter is designed separate from the programmable logic array, which array is designed according to the needs of the application.

According to another aspect of the invention, the ACI isolates the programmable logic from the rest of the custom IC circuitry for allowing diagnostics to be performed on each independently of the other. The ACI further provides support for a custom chip boundary scan chain for running Automatic Test Pattern Generated vectors on the application circuitry.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration. The attached Appendix forms part of this disclosure and is incorporated by reference as though fully set forth herein.

As used herein, the term Programmable Logic Core (PLC) refers to a building block for the development of complex, custom integrated circuits such as cell-based Application Specific Integrated Circuits (ASICs) and systems on a chip (SOC).

Figure 1:
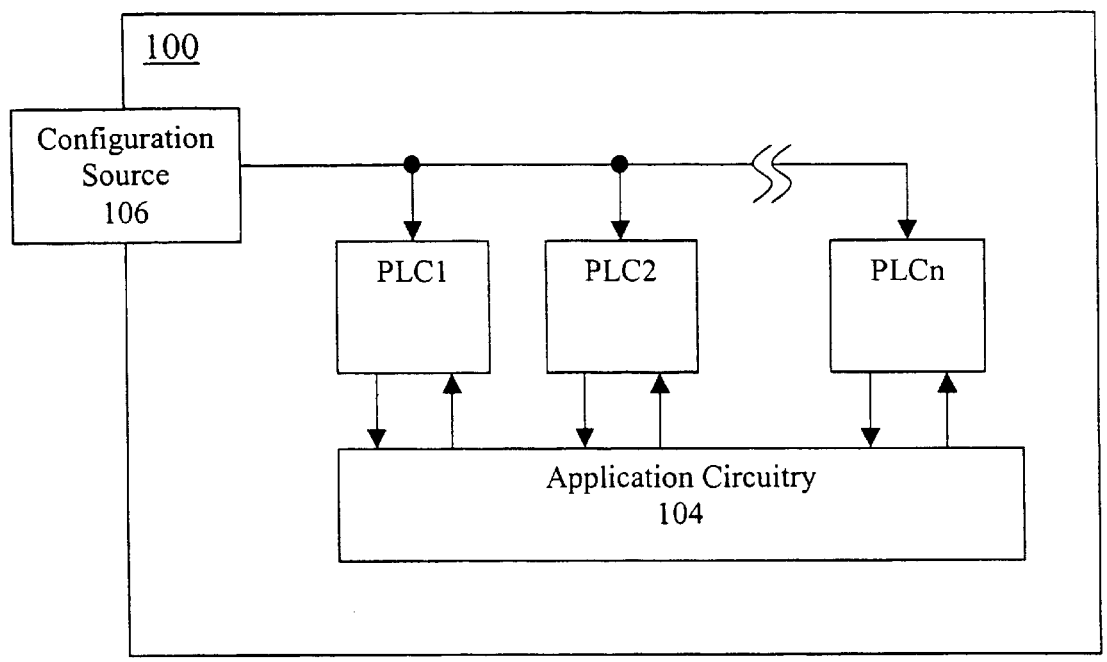
FIG. 1 is a top-level block diagram of an Application Specific Standard Product (ASSP) in accordance with the principles of the invention.

FIG. 1 is a top-level block diagram illustrating an example implementation of a custom integrated circuit according to the present invention. As illustrated in FIG. 1, an Application Specific Programmable Product 100 (ASPP) includes one or more PLC blocks PLC 1 to PLCn together with other application circuitry 104 in a combined ASIC product. The combination of the PLC with other application circuitry allows modification of the functional behavior of the PLC portion of the ASIC at my time during or after the deployment of the end product. In accordance with an aspect of the invention, the PLC includes a very high density, high-speed configurable logic structure. The gate capacity and detailed interface may be varied for each PLC to meet the needs of the target product. The configuration data that defines a specific behavior of a PLC can be loaded into storage elements in the PLC from a configuration data source 106. The configuration data source can be, for example, an on-chip ROM or an off chip Programmable ROM. In accordance with an aspect of the invention, however, the PLC includes functionality for alternatively being configured by embedded processors or other application circuitry in the Application Specific Standard Product (ASSP).

Figure 2:
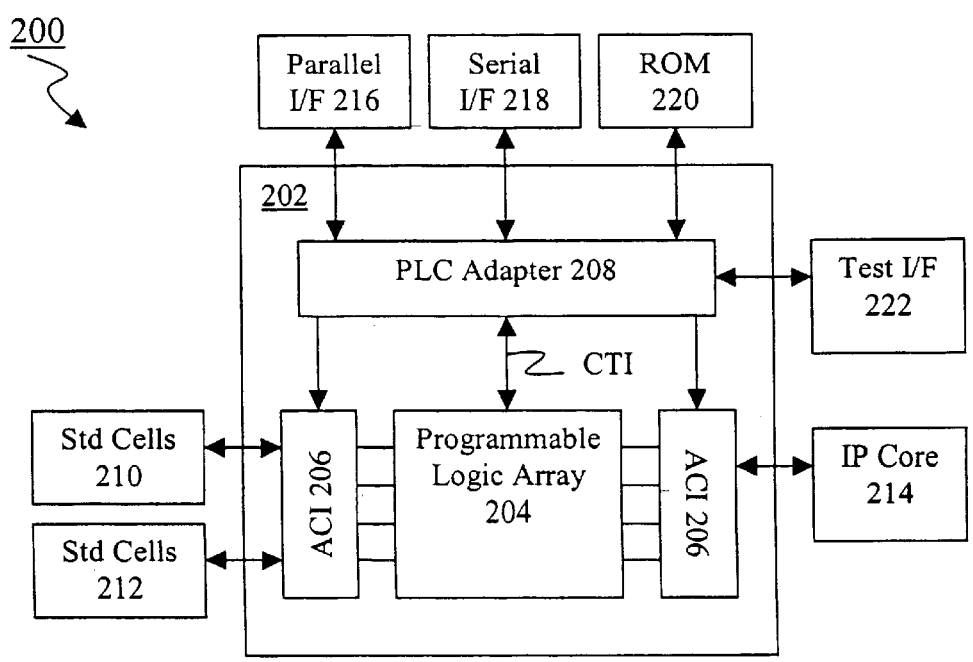
FIG. 2 is a block diagram of an ASSP having a single PLC in accordance with an aspect of the invention.

A block diagram of an example implementation of an ASSP 200 having one PLC in accordance with an aspect of the invention is illustrated in FIG. 2. As should be apparent from above, although only one PLC is shown in this example for ease of illustration, there can be several PLCs in an ASSP, Generally, PLC 202 provides the ability to embed and integrate programmable logic into an overall ASIC design, such as the ASSP 200 in this example, in accordance with certain aspects and features of the present invention.

As illustrated in FIG. 2, PLC 202 in this embodiment of the invention interfaces with application circuitry such as standard cells 210, 212. Also in this example, PLC 202 communicates with an IP core 214 (e.g., an embedded processor such as an Advanced RISC Machine (ARM) processor developed by Advanced RISC Machines Ltd. of Cambridge, UK), a parallel interface 216 (e.g., an Advanced Microprocessor Bus Architecture (AMBA) bus), a serial interface 218, and a test (e.g., TAP) interface 222. It should be noted that the number and types of interfaces is highly variable and dependent on a particular application, and that not all of the listed interfaces are necessary to the invention, while other types of interfaces are possible. For example, in one embodiment, an interface with an IT core 214 is not included. In an alternative embodiment, a test interface 222 and/or one of serial/parallel interfaces 216, 218 is not included. In a further alternative embodiment, interfaces with special types of buses are included. The present invention is intended to encompass these many variations while providing a core functionality and capability that will become apparent to those skilled in the art after being taught by the present disclosure.

In the example of FIG. 2, configuration source 106 is comprised of ROM 220 (e.g., a serial PROM such as an AT17LVO 10 from Atmel Corp. of San Jose, Calif., an ATT I 700A from Lucent Technologies, Inc. of Murray Hills, N.J. or an SCI7VOO from Xilinx of San Jose, Calif. or compatible device).

As further illustrated in FIG. 2, PLC 202 in this embodiment includes a programmable logic array (PLA) 204. In one example that will be particularly described herein, PLA 204 is comprised of an array of Configurable Arithmetic Logic Units (CALUs) called a Multi-Scale Array (MSA). Such a structure directly supports Register Transfer Level (RTL) functions such as counters and adders as well as complex state machine and random logic structures.

PLC 202 in this example further includes an Application Circuit Interface (ACI) 206 that provides the signal interface between the programmable routing resources of array 204 and the application circuitry. Generally, in accordance with an aspect of the invention, ACI 206 can be optimized for the particular programmable logic array (for example, an MSA) to be integrated into the ASSP and includes scan test registers which allow effective testing of the PLC independent of the application specific circuits, testing of the application specific circuits independent of the PLC and concurrent testing of the combined PLC and application specific circuit behavior. The ACI further provides the signal interface between the logic array (e.g., MSA) programmable routing resources and the application circuitry.

PLC 202 also includes PLC adapter 208. Generally, in accordance with an aspect of the invention, PLC adapter 208 provides control and verification mechanisms for loading configuration data into the programmable logic array (from a configuration data source and/or an on-chip processor, for example), controlling the application clock and reset signals and for testing the PLC blocks, including support for built-in self test (BIST) as well as other tests and debugging of the programmable logic array. As such, PLC adapter 208 provides an interface between standard or other buses that can be typically provided in an ASIC (e.g., serial, parallel and test interfaces) and the Configuration Test Interface (CTI), which can be designed in accordance with the particular programmable logic array desired for the particular application, as well as or including an interface between the configuration data source and the CTI.

The details of the structures and functionality of PLC adapter for supporting manufacturing test, diagnostics and debugging of the PLC will be presented below. However, generally, in one example, PLC adapter 208 supports BIST of the programmable logic array by including a BIST engine that controls and participates with BIST functionality in the programmable logic array for performing manufacturing test of the array. Further, PLC adapter 208 supports diagnostics and debugging (e.g., setting breakpoints) of the array by controlling the system and reset clocks thereto, as well as coupling to the scan chains provided in the ACI 206. These aspects of the invention will be described in more detail below.

When the programmable logic array 204 is comprised of an MSA, the logic cells in such an MSA can be implemented, for example, by one or more of the example structures disclosed in co-pending U.S. application Ser. No. 09/475,400, commonly owned by the assignee of the present invention, the contents of which are incorporated fully herein by reference. Although a programmable logic array 204 comprised of an MSA based on the principles of the co-pending application is considered preferable, the present invention is not limited thereto, and those skilled in the art will be able to understand how to extend the principles of the invention to other types of programmable logic structures and cells after being taught by the present disclosure.

One example of a design methodology that can be used to integrate a PLC, such as that described in connection with the present invention, into an overall ASIC design is disclosed in co-pending U.S. application Ser. No. 60/265,303, commonly owned by the assignee of the present invention, the contents of which are incorporated fully herein by reference. As described in more detail therein, the Multi-Scale Array (MSA) and the application circuit interface (ACI) can be provided together as a hard macro. Preferably, the PLC adapter is delivered as synthesizable HDL and may be merged with the application-specific circuitry outside of the PLC hard macro. In a preferred example implementation, the PLC directly supports register transfer level (RTL) functions such as counters and adders as well as complex state machine and random logic structures. A PLC can be used to augment application circuitry (including cell-based blocks, SRAM blocks and other core blocks), and to provide programmable control and datapath capabilities for field enhancement of the ASIC device.

By virtue of the design methodology described in the co-pending application, for example, a specific PLC can be created according to a set of user's parameters that define the size of the logic array, the type of system interface, the details of the application circuit interfaces, and selection of a PLC adapter. The specific PLC can then be integrated into an overall design (e.g., an ASIC or other custom IC) using standard ASIC development tools. The behavior of the PLC is controlled by the PLC program. The PLC program is developed using standard ASIC development tools in conjunction with automated place and route tools. PLCs can then be manufactured by the customer, along with the rest of the ASPP, using the customer's foundry. Preferably, each PLC instance uses at least four metal layers with the provision for a limited number of feedthrough connections provided as "spare ports" in the design.

Configuration data can be derived from the PLC program (using the tools disclosed in the co-pending application, for example), and stored in a configuration data source. In accordance with an aspect of the invention, the PLC adapter loads the configuration data from the configuration data source into a set of configuration data registers in the programmable logic array, collectively referred to as the configuration memory, and tests the PLC internal logic, clock and reset control, and run time interface extensions.

Figure 3:
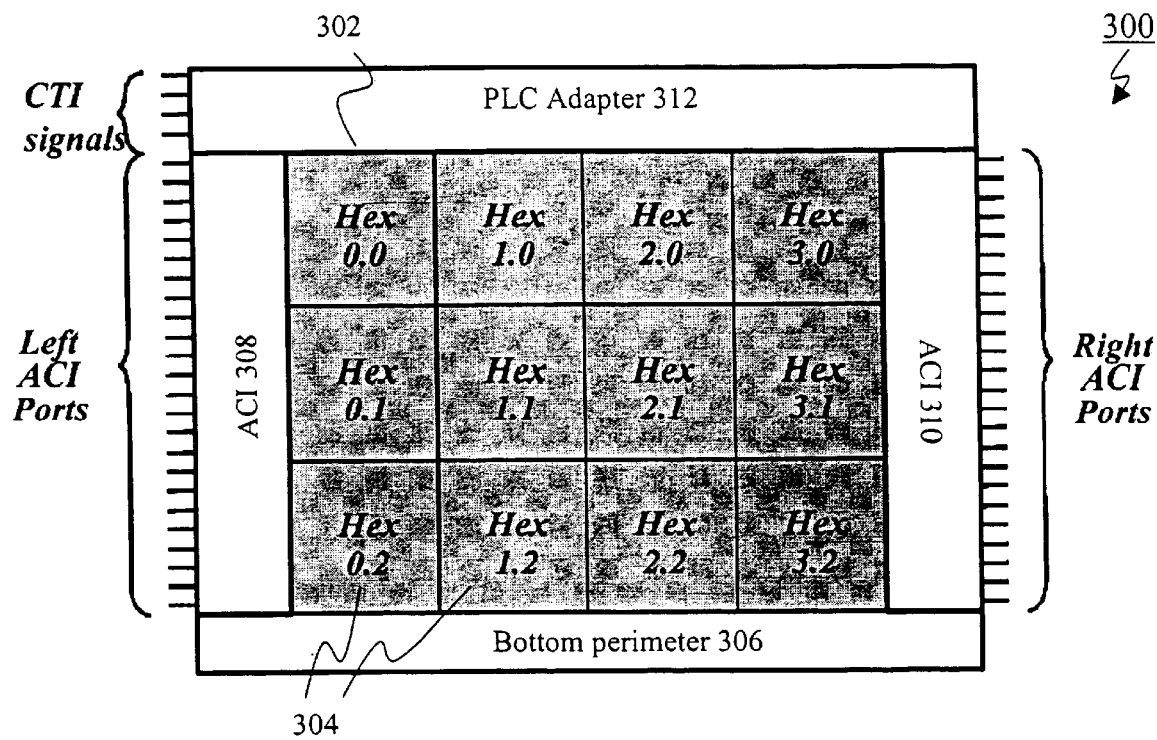
FIG. 3 is a floorplan of an example PLC that can be used to implement an ASSP such as that illustrated in FIG. 2.

FIG. 3 is a floorplan of a PLC 300 in accordance with one example implementation of the invention where the programmable logic array is comprised of an MSA.

As shown in FIG. 3, MSA 302 is comprised of an array of hex-blocks 304 and occupies most of the PLC area. The hex-block design can be identical for all products in a PLC family. The MSA is surrounded by a perimeter of four blocks 306, 308, 310, 312. The size of the perimeter blocks shown in FIG. 3 is exaggerated for discussion purposes.

The bottom perimeter block 306 is used to terminate the signals on the bottom edge of the MSA, so it need not include any external signal interfaces. The bottom perimeter block is usually very small and the design varies only by the width of the MSA. The left and right perimeter blocks 308, 310 include configuration data control logic, scan-path logic, and the ACI logic. The ACI ports can be specified in the PLC specification to use one side or both sides. In one example, the left and right perimeter blocks are the width of about one sixteenth (1/16) of a hex block. The top perimeter block 312 includes the PLC adapter and CTI control circuitry, as well as any scratchpad memories that may be included. The top block is typically a fraction of the height of a hex-block if scratchpad memories are not included, otherwise it may be quite large in accordance with the size of the memories.

Figure 4:
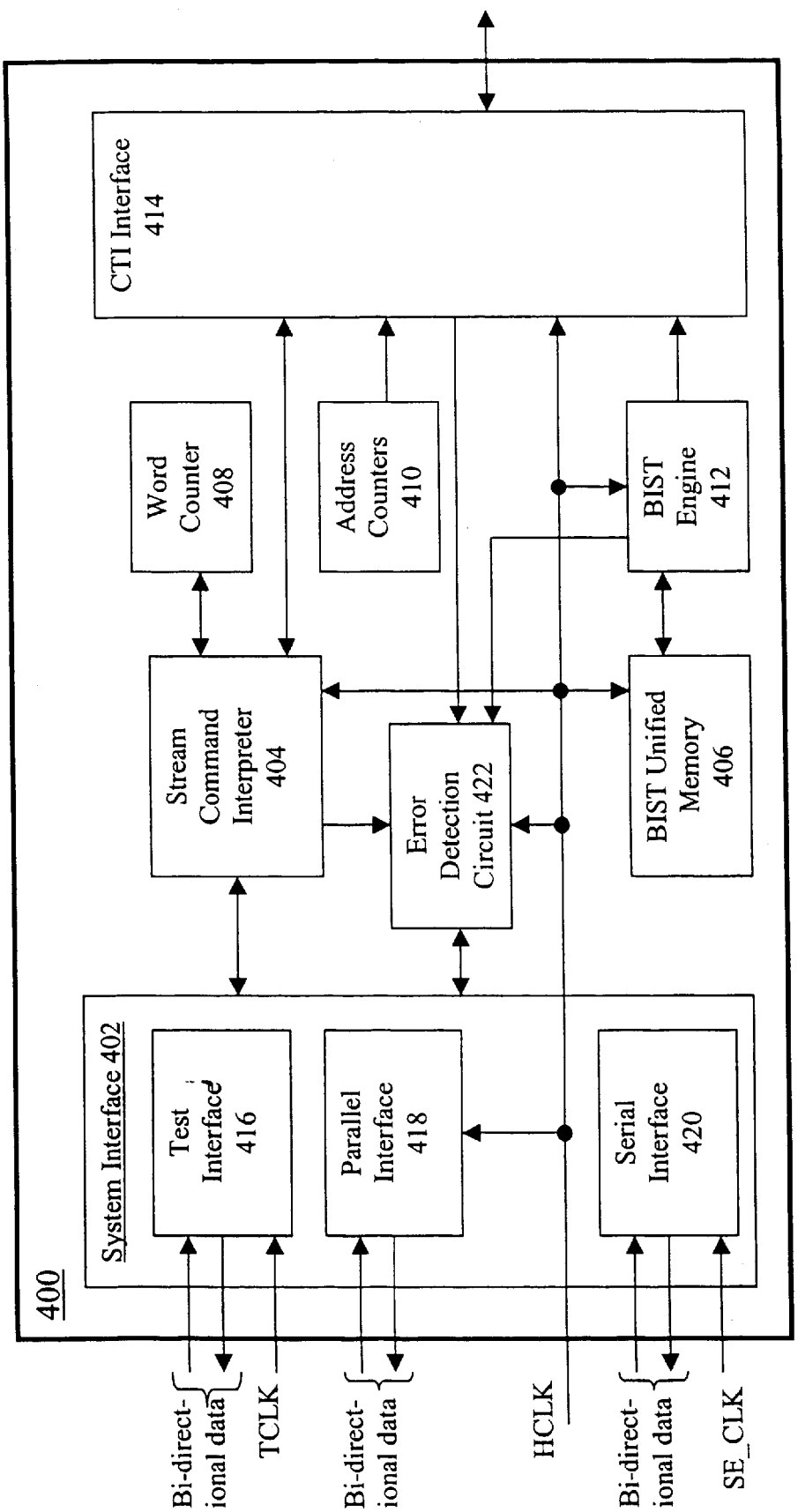
FIG. 4 is a block diagram illustrating an example implementation of a PLC adapter in accordance with the principles of the invention.

A block diagram of an example implementation of a PLC adapter 400 in accordance with an aspect of the invention is illustrated in FIG. 4.

As shown in FIG. 4, PLC adapter 400 in this example includes a system interface 402, a stream command interpreter 404, a BIST unified memory 406 (e.g., RAM), a word counter 408, an address counter 410, a BIST engine 412, a CTI interface 414 and an error detection circuit 422. As further shown in FIG. 4, system interface 402 includes test (c.g TAP) interface 416, parallel interface 418, and serial interface 420. Test interface 416 communicates with external circuitry via bidirectional test interface signals and a clock signal TCLK. Parallel interface 418 communicates with external circuitry via bidirectional parallel configuration interface signals and a clock signal HCLK. Serial interface 420 communicates with external circuitry via bidirectional serial interface signals and a clock signal SE_CLK. It should be noted that PLC adapter 400 further includes many registers and other supporting circuitry that will become apparent in view of the discussion below. However, to the extent that they are not described, such additional descriptions are unnecessary for an understanding of the invention.

It should be further noted that this example implementation of PLC adapter 400 is in accordance with the selection and types of interfaces illustrated in FIG. 2. However, as discussed in connection with FIG. 2, the illustrated selection is provided as exemplary rather than limiting. Those skilled in the art will recognize the types of changes required to be made to PLC adapter 400 in accordance with other selections of numbers and types of interfaces after being taught by the example provided herein. The present invention encompasses the many embodiments of the PLC adapter that correspond to such other selections. However, in accordance with an aspect of the invention, all such embodiments will at least include the ability to configure and test the embedded programmable logic array in an equivalent manner to the techniques described below.

Moreover, although the above components of the PLC adapter have been shown and will be described separately for clarity of the invention, it should be recognized that certain of the functionalities associated therewith may be combined and divided in various ways among fewer or more components.

Figure 5:
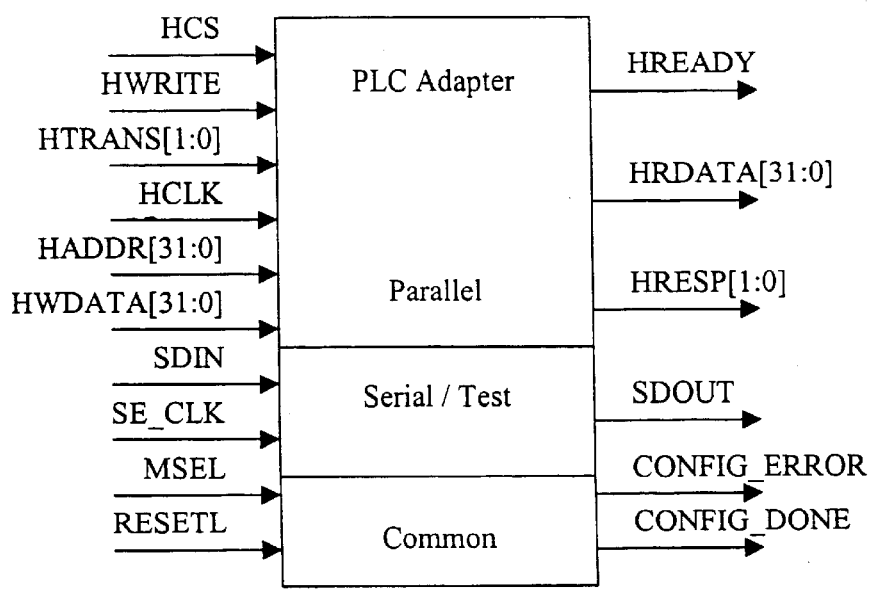
FIG. 5 illustrates the top-level interfaces of a PLC in accordance with certain aspects of the invention.

FIG. 5 is a block diagram further illustrating an example of the interface signals for a PLC adapter such as that illustrated in FIG. 4. Such a description and the descriptions that follow will allow those skilled in the art to understand a corresponding example implementation of system interface 402. It should be noted that, in this example, the serial and test signals are commonly provided but this is not necessary. It should be further noted that, in the discussion of example signals and registers associated with the PLC adapter below, the term "ASIC" refers to a processor or other application circuitry that communicates with the PLC. Those skilled in the art will recognize that a detailed description or illustration of such circuitry is not necessary for an understanding of the present invention.

In this example, a user is able to choose between types of interfaces through a mode select signal MSEL. MSEL is sampled on each clock cycle to determine the configuration mode. It is expected that switching between parallel and serial/test modes will not be selected in the middle of a transaction. Further, when switching from parallel to serial/test or vice versa, several idle cycles should pass before a new transaction is sent to the adapter. As shown in FIG. 5, the four signals: MSEL, RESETL, CONFIG_ERROR, and CONFIG_DONE are common to both parallel and serial configuration modes, and these are described in Table 1.

TABLE 1

| Name | Source | Description |
| --- | --- | --- |
| RESETL | ASIC | Active low reset used to reset the bus and the programmable logic array. |
| MSEL (Mode Select) | ASIC | Selects parallel or serial modes. |
| CONFIG_DONE | PLC | Configuration process completed successfully and the adapter received a write to the Start Register. |
| CONFIG_ERROR | PLC | Configuration process failed. |

RESETL is the PLC reset signal. In one example, RESETL will be active low for 50 msec after the operating core VDD enters the operating range. The core VDD operating range can be, for example, Vnom+/−10%. At my time that the voltage departs from operating range, it is expected that the RESETL signal will go active low. The CONFIG_ERROR signal indicates that the error detection circuit 422 detected an error. The CONFIG_ERROR signal could go high at any time following an error detection check command and stay high. The CONFIG_ERROR signal is reset with the RESETL signal on power-up or by issuing a reset-config-error command. The CONFIG_DONE signal indicates that the PLC has been CRC successfully configured and would only go high after a Write to the Start Register and stay high until another Write Configuration Data Command is received.

Table 2 describes an example of the mode selection for MSEL level.

TABLE 2

| MSEL | Description |
| --- | --- |
| 0 | Serial/Test Configuration |
| 1 | Parallel Configuration |

The parallel interface in one example of the invention is defined to make it easy to interface to many standard 32-bit processor buses. For example, it can be defined to require no additional logic to interface to an AMBA AHP bus.

Table 3 describes the parallel interface signals in accordance with one example.

TABLE 3

| Name | Source | Description |
| --- | --- | --- |
| HADDR[31:01] (address) | ASIC | 32-bit system address bus. |
| HTRANS[1:0] (transfertype) | ASIC | Indicate the type of the transfer that can be IDLE or NON-SEQUENTIAL. |
| HWRITE (transfer direction) | ASIC | When High indicates a write transfer, else a read transfer. |
| HWDATA[31:0] (write data bus) | ASIC | Write Data bus. |
| HCSN (Chip Select) | ASIC | Active low. Indicates that the current transfer is intended for the PLC configuration. |
| HRDATA[31:0] (read data bus) | PLC | Read data bus. |
| HREADY (transfer done) | PLC | This signal may be driven low to extend a transfer. |
| HRESP[1:0] (transfer response) | PLC | The transfer response provides additional information on the status of a transfer. OKAY and ERROR are the only possible responses. |
| HCLK | PLC | For example, the AMBA bus clock. |

The write data bus is used to move data into the PLC, while the read data bus is used to move the data from the PLC. Each transfer is pipelined into two cycles: an address and control cycle; and one or more cycles for the data. In one example, the address cannot be extended. The data, however, can be extended by the PLC by driving the HREADY signal low. During a transfer the PLC will show the status using the response signal HRESP.

In one example implementation, the PLC parallel bus transfer consists of two distinct sections: an address phase, which lasts a single cycle, and a data phase which may require several cycles. It is extended using the HFREADY signal. In a simple transfer with no wait states, the ASIC drives the address and control signals onto the bus after the rising edge of HCLK and the PLC adapter then samples the address and control information on the next rising edge of the clock. After the PLC adapter has sampled the address and control it can start to drive the appropriate response and this is sampled by the ASIC on the third rising edge of the clock. The PLC may insert wait states into any transfer, which extends the transfer allowing additional time for completion. It should be noted that for a write operation the ASIC may hold the data stable throughout the extended cycles. For read operations, the PLC does not have to provide valid data until the transfer is about to complete.

In one example of the invention, two transfer types are supported by the PLC, as indicated by the HTRANS signal and shown in Table 4.

TABLE 4

| HTRANS | TYPE | Description |
| --- | --- | --- |
| 00 | IDLE | Indicates that no data transfer is required. |
| 10 | NONSEQ | Indicates a valid new single transfer. |

As a further example, two responses are possible by the PLC as indicated by the HRESP signal and shown in Table 5.

TABLE 5

| HRESP | TYPE | Description |
| --- | --- | --- |
| 00 | OKAY | When HREADY is high, this shows that the transfer has completed successfully. |
| 01 | ERROR | This response shows that an error has occurred. Error response will be over two cycles. That is achieved with at least one wait state using the HREADY signal. |

In an example implementation using the AMBA AHB bus, the bus interface will expect a pre-decoded active high HSEL signal. Inside the adapter, the address map can be split into two sections according to the following Table 6:

TABLE 6

| HADDR[19]OH | Description |
| --- | --- |
| 0 | Selects Adapter byte-stream input. |
| 1 | Selects BIST RAM. HADDR [7:0] go directly into the ram address. |

In serial configuration mode, the PLC is configured by loading one bit per SE_CLK cycle. The SE_CLK and the RESETL pins are driven by the ASIC. The MSB of each data byte is written to the SDIN first. The serial bit stream can come from a serial PROM such as the ATT 1700A made by Lucent Technologies or the XC17VOO made by Xilinx. SDOUT can be used during test as a scan output.

Table 7 provides an overview of the serial interface signals according to one example implementation.

TABLE 7

| Name | Source | Description |
| --- | --- | --- |
| SDIN | ASIC | serial configuration data input. |
| SE_CLK | ASIC | serial configuration clock input. |
| SDOUT | PLC | serial configuration data output. |

In one example, the serial bitstream must be setup at the SDIN pin a short time before each rising edge of SE_CLK.

It should be noted that, according to an aspect of the invention where multiple PLC instances are provided, it is possible to configure the multiple PLC instances by tying the inputs to all the corresponding PLC adapters together. In such an alternative embodiment, their outputs can be logically gated to present an overall configuration status. Configuring multiple PLC instances is made possible in both serial and parallel modes by allowing each PLC instance to respond only to its own configuration stream as identified by a PLC_Instance ID command.

Figure 6:
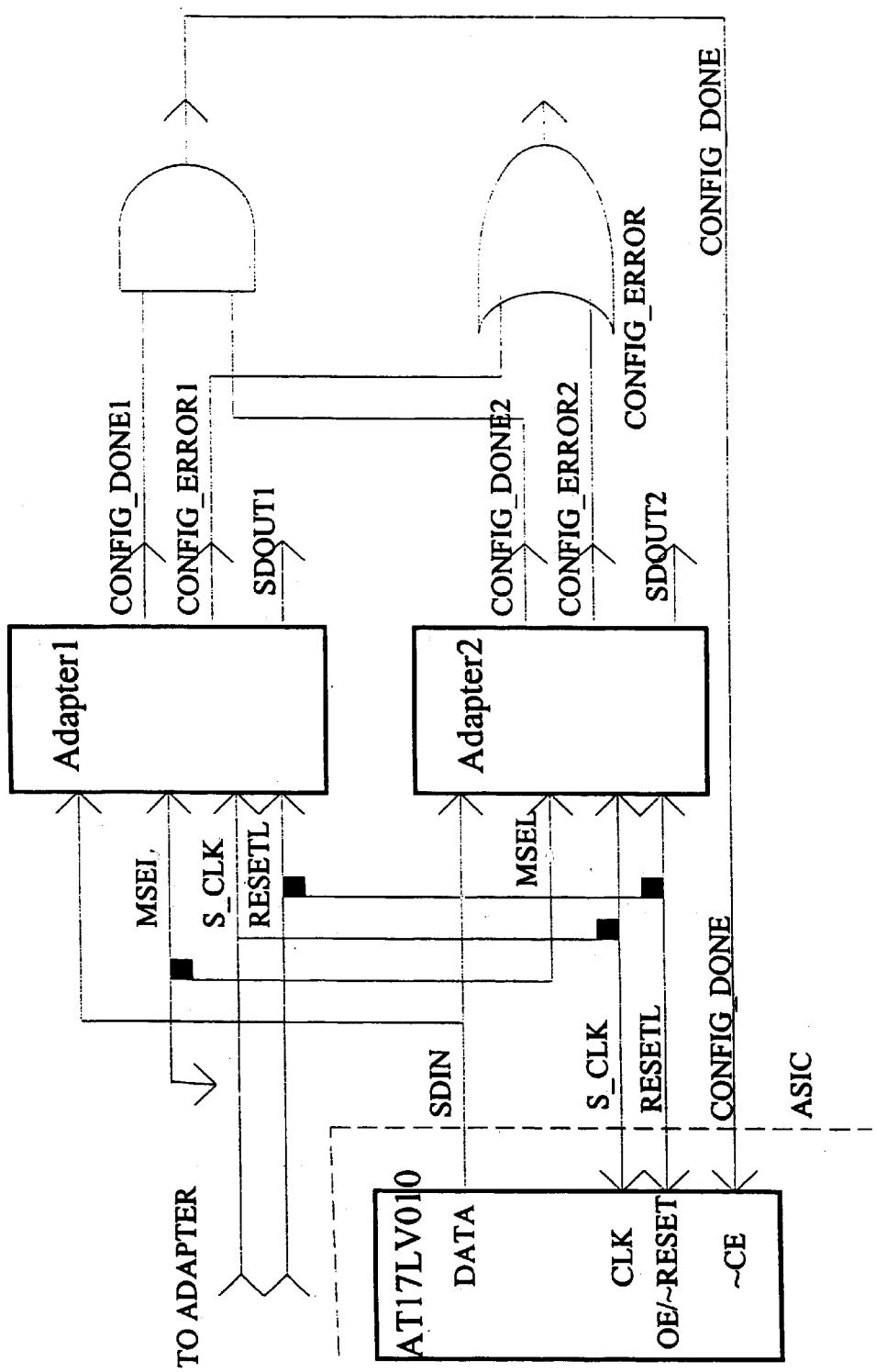
FIG. 6 illustrates how PLC adapters associated with multiple PLC instances can be interconnected in accordance with an aspect of the invention.

FIG. 6 is a block diagram showing an example implementation where two PLC instances and two adapters are connected to the same SPROM to be configured serially. MSEL is tied low in this case while the clock and reset that are generated by the ASIC drive both adapters and the SPROM reset and clock inputs. The DATA pin on the SPROM is connected to the SDIN input of both adapters. The configuration data for the two instances is stored sequentially in the SPROM. The CONFIG_DONE signals of both adapters are combined through logical AND operations to drive the ~CE pin on the SPROM. If multiple instances exist on the chip, SDOUT outputs need to be multiplexed out during test mode.

Configuring multiple PLC instances through the parallel interface is also possible. Each PLC instance will listen to its own stream identified by its own PLC_instance_ID when its own HCSN signal is active. The HIRDATA bus, HREADY, and HRESP signals will have to be multiplexed back to the bus master.

Referring back to FIG. 4, stream command interpreter 404 receives commands and inputs from the system interface and controls the BIST engine as well as the programmable logic array (e.g., MSA array) configuration state. It is the engine that interprets the PLC stream software commands into writes and reads to the various configuration registers and memory. In doing so, stream command interpreter 404 converts the addresses in the PLC stream to the address format of the associated PLC instance.

Another function of the stream command interpreter is to cause the error detection circuit 422 to continuously calculate a signature for the PLC stream and be ready to execute an Error Detection command when received from the PLC stream, as will become apparent from the descriptions below.

In one example implementation, the PLC stream format is little Endian.

Accordingly, the parallel and serial configuration interfaces must insure that the stream command interpreter receives words in the same format regardless of the endianess of the processor mastering the configuration bus or of the PROM providing the PLC stream.

Table 8 lists the commands supported by the stream command interpreter in accordance with one example implementation. Following the table is a further description of some of the command parameters identified in the table.

TABLE 8

| Op Code | | Operation | Description | | ERRD | Word Count Length |
| --- | --- | --- | --- | --- | --- | --- |
| 0000 | 0 | PLC stream information | PLC Instance Id | Sub-Op 0 | Y | 1 |
|  |  |  | PLC Program Id | Sub-Op 1 | Y | 1 |
| 0001 | 1 | Configuration Data | R/W Configuration Data | | Y | 2 ^ 16 max |
| 0101 | 5 | Synchronize | Synchronize the beginning of a PLC Stream | | N | 0 |

TABLE 8-continued

| Op Code | | Operation | Description | ERRD | Word Count Length |
|---|---|---|---|---|---|
| 1100 | C | CSR | R/W Control/Status Registers | Y | 2 |
| 1111 | F | NOP | No Operation | N | 0 |

PLC Instance Id: In accordance with an aspect of the invention, each PLC stream contains a PLC Instance Id that identifies the particular PLC instance with which it is associated. Thus, a PLC instance cannot be programmed with the wrong PLC stream. In one example, there is a PLC Instance Id at the beginning of each PLC stream. A PLC stream for a different PLC instance begins with its own distinct PLC Instance Id. Only the single word format of this command is supported by this example implementation. This command participates in the Error Detection calculation.

In one possible implementation in accordance with the co-pending design methodology application, the ASIC designer specifies the PLC instance ID for the PLC instance in an adapter "define.v" Verilog file. Such a file could thus specify the "PLC_INSTANCE_ID" parameter for an adapter and each PLC instantiation. After synthesis, place and route, the adapter will thus only accept PLC streams associated with the "PLC_INSTANCE_ID" parameter it was compiled with.

PLC Program Id: A PLC instance may be configured with several PLC programs during the operation of that PLC instance. The PLC Program Id is a field (one or more words) within the PLC stream that identifies the PLC program from which the PLC stream was derived. This field is not used by the PLC instance itself, but is used by applications that manage the PLC streams. Only the single word format is supported in this example implementation. This command participates in the error detection calculation.

READ & Write Configuration Data: This operation reads and writes configuration data from/to the PLC instance. Only the Immediate format (IM=1) is supported in one example implementation. In one example where the read/write configuration data command is a 32-bit word, the Word Count for the transfer is contained in bits 16:31 of word 0 of the command. A Starting Address is stored in a Configuration Address register before executing a Read or Write Configuration Data operation. Only one destination (DEST=0) is supported in one example implementation. When this Operation executes, the Configuration Address register is read from the PLC and gets incremented until the Word Count has been exhausted.

Synchronize: In one example implementation, a PLC stream begins with a Synchronize operation. This operation is used for two purposes. First, it can be used by asynchronous serial configuration interfaces to find the beginning of the PLC stream. Second, this "operation" can be recognized as a Unix "magic number", identifying the file as a PLC stream file.

Nop: A generated PLC stream may be padded with no operation (NOP) commands in its beginning. This operation can be issued before the synchronize command to make sure that no bits are lost during the power-up operation, for example.

RW Control/Status Registers (CSR): This operation is used to read and write the PLC adapter control status registers. According to one example implementation shown in Table 9, the following is a set of control status registers that can be implemented in a PLC adapter.

TABLE 9

| # | Register | W/R | Mask | Description |
|---|---|---|---|---|
| 0 | Error Detection (ERRD) | WR | N | Signature Check. Error detection for PLC stream. |
| 2 | Status/Control | WR | Y | Status and control of the PLC and the Adapter |
| 4 | PLC_Instance_Id | R | N | PLC Instance Id (Read only) |
| 8 | X Configuration Address | WR | N | X Address Register for Reading and Writing Configuration Data |
| 9 | Y Configuration Address | WR | N | Y Address Register for Reading and Writing Configuration Data. |
| C | Start Command Register | W | N | Write only register that initiates PLC operation |
| D | BIST starting and Ending Address | WR | N | BIST Starting and ending address. |
| E | BIST Compare Input/OutputCS Register | WR | Y | Drives and receives the CTI signals. |
| F | BIST Operation and Force Control Register | WR | Y | Drives the ACI control signals as well as the BIST Force bus. |

Error Detection Register: The error detection circuit for the adapter operates in four different modes in one example implementation. In the serial interface mode (MSEL=0), a serial signature will be calculated based on each bit received. When the adapter is connected to a bus or a processor such as in parallel interface mode (MSEL=1), there is a lesser chance of errors occurring in the system. The error detection circuit operates in a Multiple-Input-Signature Register "MISR" mode where all 32 bits are fed into the signature register in one cycle. The third mode is the built-in self test (BIST) mode. The error detection circuit still operates in MISR configuration. The MISR is cleared upon enabling BIST. During BIST mode, the Bitout[7:0] output from the programmable logic array (e.g., MSA hard macro) is fed in parallel into the misr-reg[31:24] field. While the MISR implementation has more chances of masking errors, it should be sufficient for the parallel implementation. The fourth mode is during a configuration memory monitoring operation. The error detection circuit will calculate the signature on the whole stream that is being read back and flag an error when such is detected. The adapter can even interrupt a processor when that happens. This operation is used to detect my sell error or other failures in the configuration memory during normal operation of the PLC.

Both the serial signature and the MISR functions can be calculated according to the following polynomial:

$$ERRD\text{-}32 = X^{32} + X^{22} + X^2 + X + 1$$

Because the check value for the serial signature function will be different from the check value for the parallel/MISR function implementation, two values are needed. The error detection register will hold the signature-accumulated value for the current mode of operation. The software or other functionality that is used to generate and/or store the configuration data will generate both values needed to check the serial and parallel error detection implementations. One of the two error-detection registers are checked when a Write CSR/ERRD operation is executed. The Write CSR/ERRD command is followed by 2 words, the serial signature check value and the MISR check value (e.g., the Mask value is replaced with the serial signature check value since the mask value is not needed for error detection check operations). Upon receiving a write CSP/ERRD command, the hardware will only check the register matching the configuration mode in operation using the appropriate check value provided. Whether in serial or parallel configuration mode, no write operation is performed. Instead, the appropriate serial signature or MISR value is added to the appropriate register according to the configuration mode as they are in any other operation that contributes to the error detection calculation.

If the appropriate error detection register result is "0", then the ERRD calculation was correct. If the value is not zero, then the action specified by the ERRD_Error_Action bits in the status register is taken.

Status Register: Table 10 illustrates an example of the fields contained in a status register in accordance with this implementation,

TABLE 10

| Status Register Bits | R/W | Description |
| --- | --- | --- |
| 0 Last_Command_is_start | RW | 1 Start command is the last configuration command. Go to sleep after.<br>0 There could be other configuration commands after Start command. |
| 1 ERRD_Error_Halt | RW | 1 Halt configuration if a signature error is detected.<br>0 Ignore signature errors if detected. |
| 2 ERRD Enable | RW | 1 Enables Error Detection checking.<br>0 Disables Error Detection checking, Error Detection registers are reset to 0s. |
| 3 ACI_FORCE | RW | 1 Will cause the ACI to force PLC outputs to the ASIC to be a constant "1" value. This will isolate the ASIC from intermediate state oscillations of the PLC output pins during programming or BIST. At the current time it is not possible to sub-divide the ACI for partial forcing. The Force occurs immediately after the update of the OCR register<br>0 Will release the ACI buffers such that the value driven to the ASIC will be that generated by the Hnnn PLC output. The release occurs immediately after the update of the OCR register. |
| 4 BIST_Enable | RW | 1 Starts the BIST operation from the address in the X configuration address Register.<br>0 Stop and reset the BIST engine. |
| 8:9 Num_Config_Reads | W1 R | Number of times the configuration bits can be read if Config_Read Disable is set to 1. A value of 0 for this field and a 1 for the next field means the configuration data (including via BIST and Check operations) cannot be output from the PLC. If this value is non-zero, it is decremented for each Read Configuration operation. |
| 10 Config_Read_Disable | W1 R | 1 to disable configuration Read and Check and BIST configuration probing (subject to the value of bits 17:16 of this register and to disable further writes to bits 18:16 of this register.)<br>0 to allow configuration and BIST configuration probing |
| 20 ERRD_Error | R | 1 if signature error detected. Remains 1 until reset by a ERRD command.<br>0 if no signature error detected |
| 21 ADDR_OUT_OF_BOUNDS | R | 1 if initial configuration address accessed outside the valid range of addresses. Remains 1 until cleared<br>0 otherwise |
| 22 Config_Busy | R | 1 if the configuration logic is being read or written<br>0 otherwise |
| 23 Config Done | R | 1 if the last configuration write completed.<br>0 otherwise |
| 25 Config_Id_Match | R | 1 if the PLC Instance Id matches the Current PLCStream PLC Instance Id<br>0 otherwise |
| 27 BIST_Halt_Mode | R | 1 if last BIST run was executed in the Halt Mode which means the BIST will stop or may have stop at the point of the first voting failure.<br>0 otherwise.<br>Updated asynchronously from the BIST Engine Status Register |

TABLE 10-continued

| Status Register Bits | R/W | Description |
|---|---|---|
| 29 BIST_Fail | R | 0 if no part of the BIST has a voting fault since the start of the last BIST instruction<br>1 if my part of the BIST ran has a voting fault the bit will immediately go high. Updated asynchronously from the BIST Engine Status Register |
| 30 BIST_Done | R | 0 part if any of BIST are still executing<br>1 BIST Done |
| 31 BIST_Executing | R | 1 if any part of the BIST is executing<br>0 otherwise. |

PLC Instance ID Register: This register is a read only register and it contains the PLC Instance Id. In accordance with one example implementation where the programmable logic array is comprised of a MSA having a maximum array size of 16×16, the PLC instance Id is provided in bits [15:0] of a 32-bit register, and the X and Y array dimensions of the array are in the fields [27:24] and [31:281] respectively.

Configuration Address Registers: In an example implementation where the programmable logic array is implemented as an array of blocks (e.g., an MSA), the X and Y Configuration Address Registers contain the next address to be read or written by a Read Configuration or Write Configuration operation. When these registers are read, they will provide the current X address and Y address counter values respectively.

Start Register: In one example, this is a write only register and any write to this register ends the initial configuration operation and puts the PLC in normal operation mode. For example, the CONFIG_DONE signal will go high upon receiving a write to this register assuming that no configuration errors were encountered during the programming process. The CONFIG_DONE signal stays high until mother Write Configuration Data command is received by this adapter. The CONFIG_DONE signal is reset on power-up. If the Last-command-is-start bit is set in the status register, the adapter will go into a low power mode, the adapter will turn off its internal states and quit listening to the external buses since it does not expect any further configuration operations. In a further example, this register contains an "ALL" bit. This makes it possible to synchronize all PLC modules' start conditions by setting the "ALL" bit high. Each adapter will monitor this bit in this command even if its own PLC_INSTANCE_ID is not set. If a "START" command is received after configuration with this bit set, then the PLC switches to operation mode. This will enable the user to synchronize the start-up condition of multiple PLCs in the system, for example.

BIST Starting and Ending Address Register: Specifies the BUST Starting and Ending Addresses in BIST memory 406.

BIST Compare Input/Output Register: The BIST Compare Input/Output register allows reading and writing of BIST test patterns and results.

BIST Operation and Force Register: Table 11 illustrates an example of the fields for this register (i.e., the "OCR"). The adapter can use the signals described in Table 11 to control the starting, stopping and single-stepping of the clock to the programmable logic array (part of diagnostics, for example).

TABLE 11

| Status Register Bits | R/W | Description |
|---|---|---|
| 0:13 Force | RW | Force Bus |
| 14:15 BISTforce1, BIST force2 | RW | BIST force signals. |
| 16 N2NDIN | RW | N2NDIN |
| 17 D_resetb | RW | Resetb on hard macro. It is reset to 1 on power up. |
| 18 N/A | | |
| 19:20 RST_DATA1, RST_DATA2 | RW | 1 If the RST_Forcex bit is 1 then the value in the RST_Datax register drives SRSTx. The bit register will be designed to not glitch if a 1is reloaded into the register.<br>0 If the RST_Forcex bit is 0 then the value from the ASIC drives SRSTx. The bit register will be designed to not glitch if a 0 is reloaded into the register. |
| 21:22 RST_FORCE1, RST_FORCE2 | RW | 1 The ACI will transfer control of the SRSTx from the ASIC to the RST_Datax register. The RST_Datax register will get control of the SRSTx after the update of the OCR. The bit register will be designed to not glitch if a 1 is reloaded into the register.<br>0 The ACI will transfer control of the SRSTx from the RST_Datax register to the ASIC. The ASIC will get control of the SRSTx after the update of the OCR. The bit register will be designed to not glitch if a 0 is reloaded into the register. |

TABLE 11-continued

| Status Register Bits | R/W | Description |
|---|---|---|
| 23:24 CLK_DATA1, CLK_DATA2 | RW | 1 If the CLK-Forcex bit is 1 then the value in the CLK_Datatx register drives SCLKx. It is recommended that during CLK_Forcex transitions CLK_Datax be "1". The bit register will be designed to not glitch if a 1 is reloaded into the register.<br>0 If the CLK_Forcex bit is 1 then the value in the CLK_Datax register drives SCLKx. The bit register will be designed to not glitch if a 0 is reloaded into the register. |
| 25:26 CLK_FORCE1, CLK FORCE2 | RW | 1 The ACI will transfer control of the SCLKx from the ASIC to the CLK_Datax register. The transfer is synchronized with the rising edge of SCLKx. The CLK_Datax register will get control of the SCLKx on the first rising edge of the SCLK2 after the update of the OCR. The bit register will be designed to not glitch if a 1 is reloaded into the register.<br>0 The ACI will transfer control of the SCLKx from the CLK_Datax register to the ASIC. The transfer is synchronized with the rising edge of SCLKx. The ASIC will get control of the SCLKx on the first rising edge of the SCLKx after the update of the OCR. The bit register will be designed to not glitch if a 0 is reloaded into the register. |
| 27:30 N/A | | |
| 31 N2NDOUT | R | N2NDOUT |

Figure 7:
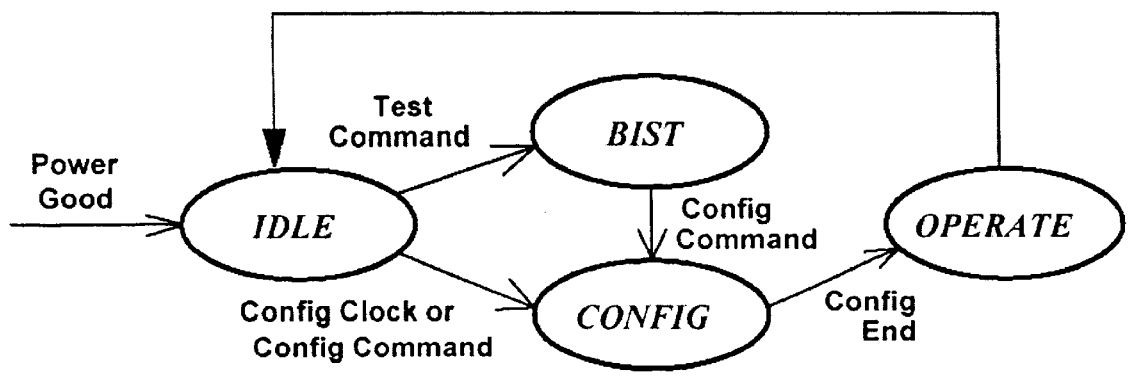
FIG. 7 is a state diagram illustrating the overall operation of a PLC adapter in accordance with the invention.

An example of the major functional states of the PLC adapter according to one implementation is shown in FIG. 7. As shown, the PLC adapter performs no operations until the "power good" signal is asserted and enters an IDLE state.

For the manufacturing test process, the PLC adapter will enter the self-test "BIST" state upon receipt of the appropriate test command. A command can also be used to force the PLC adapter to enter the "CONFIG" state. For normal end use, the PLC adapter enters the "CONFIG" state after power up as soon as a configuration clock is received. After completion of the configuration process, the PLC adapter enters the "OPERATE" state at which time the normal application clocks control the sequence of operations of the embedded programmable logic array.

In one example, the maximum operating frequency of the test interface is 10 MHz. An example set of the test functions that can be invoked include the following: PLC core force—Disconnects the programmable logic array from the ACI signals. This ability, shared by programming logic and BIST logic in the adapter, causes the ACI application circuit Outputs to be forced to all '1s' and the inputs from the application circuits to be ignored. This state allows the programmable logic array to be fully tested using the BIST circuitry; ACI scan—Allows the values of signals that are normally programmable logic array outputs to be set for testing the application circuitry outside of the PLC. This uses the test system as a means of loading and updating the values. This also allows sampling signals that are normally programmable logic array inputs; PLC debug—Disconnects the programmable logic array from the ACI signals and allows scan access to the PLA global routing structure; Begin self test—Enables the PLC BIST operations; Read BIST result—Inserts the results of the BIST into the scan path sequence. Operational control—Includes clock control, reset control, the ability to read and write programmable logic array registers and so forth. The operational controls for a specific PLC instance can be limited by aspects of the boundary scan mechanisms external to the PLC; Program Verify—The test circuitry can load a configuration stream (PLC Stream) to program or verify a PLC instance.

Preferably, for configuration of the embedded programmable logic array from a configuration data source rather than from an on-chip processor, the PLC adapter supports the use of off-the-shelf serial ROM devices to supply the configuration data. In this option, the serial interface 420 can include a configuration data source (CDS) interface that uses a 4-pin signal interface to an external serial ROM device, including a configuration clock source. The clock source is typically derived from the ASPP system clock (or one of the application clocks SCLK1 or SCLK2).

The number of configuration bits for each PLC depends on the size of the programmable logic array (e.g., the MSA array size). For example, a value of 45,000 bits per hex block can be used for planning purposes. Several PLC instances can be chained together and use the same configuration data source ROM device and interface. The serial ROM interface preferably complies with industry-standard serial configuration PROMs.

The CDS interface supports the reading of the PROM. The interface pins are described below: DATA—Data Input from the serial ROM used to initialize the configuration state machine and to load the PLC configuration data storage; RESETIOE—This Output is Used to reset the serial ROM address counter. Also when reset is active, the Data output is tri-stated. When reset is not asserted, the ROM is ready for reading; CE—When high, the DATA output is tri-stated, the address counter is disabled and the ROM is in a low power state; CLK—Each rising edge increments the ROM address counter, and depending on the other signals, the contents of the incremented address will appear on DATA. In one example, this signal can operate up to 15 MHz and requires a physical interface of up to 3.3V DC.

Figure 8:
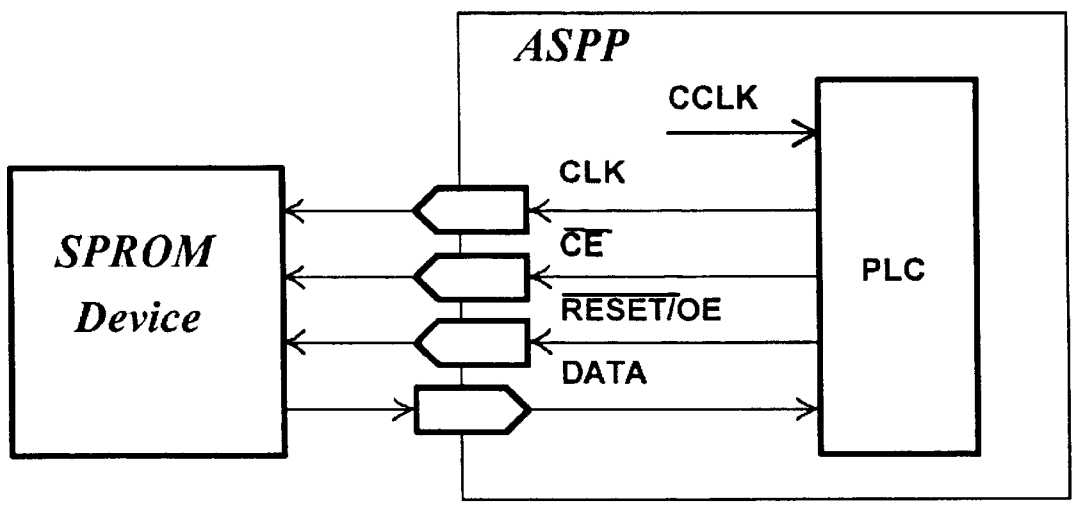
FIG. 8 is a top-level block diagram illustrating an example interface between a PLC and a configuration data source in accordance with an aspect of the invention.

FIG. 8 demonstrates the simplest use of the CDS interface. In this example illustration, there is one PLC instance and the configuration data source is a serial PROM connected to the four basic interface signals. The CDS interface can support up to four PLC instances in accordance with one aspect of the invention. The interface also supports cascading of multiple serial PROMs for storing configuration data for multiple PLC instances. The source of the configuration clock is an internal signal called CCLK that is generated in other circuitry in the ASPP.

Referring back to FIG. 4, BIST engine 412 controls the execution and report of built-in tests of the programmable logic array and other PLC circuitry via the CTI using patterns stored in BIST unified memory 406. One example of BIST support in a programmable logic army that can be used in conjunction with the BIST engine of this embodiment is disclosed in Ser No. 09/569,741 entitled "Apparatus and Method for Self Testing Programmable Logic Arrays," commonly owned by the assignee of the present invention, the contents of which are incorporated by reference as though fully set forth herein.

As described above, the primary function of BIST engine 412 is manufacturing test of PLCs. The PLC BIST engine methodically tests the validity of all function blocks and routing resources within the core programmable logic array. In an example where the programmable logic array includes a MSA, this includes exhaustive tests of each programmable routing resource, every truth table entry of the function cells and ALU controller blocks, and a complete test of the configuration memory. The BIST circuit test coverage should be consistent with industry standards. The PLC BIST result register includes a summary of pass/fails and can be used to deduce failed circuits.

For diagnostic support, the BIST can be interrogated through the adapter at the point of failure to determine the components of the PLC instance under test, and therefore those that failed.

As illustrated above, the BIST control register is used to execute BIST commands from the external TAP. The register writes control signals but reads the BIST CRC value for review. In one example implementation, the BIST system takes control of the programmable logic array on the BIST Sample/Preload UpdateDR rising edge when the execute bit is set. This will also drive the ACI force signal making all programmable logic array outputs 1.

CTI interface 414 controls the transfer of data from and to the programmable logic array via the CTI using address counter 412, which can be implemented as a finite state machine, for example. CTI interface 414 also includes circuitry that controls the clocks to the programmable logic array and couples to the scan chains in the ACI for controlling the execution and report of other diagnostics, tests and debugging operations involving the PLC, such as boundary scan, breakpoints, single-step, etc. This effectively exposes the testability of the embedded programmable logic array to a processor or other application circuitry. In this regard, the CTI interface is responsive to test commands coming from any of the system interfaces or the stream command interpreter. Such commands can include BIST-like commands, that allow additional manual test functions to narrow down the cause of a test fault. The CTI interface can even allow the setting of a hardware breakpoint to stop execution when a certain condition occurs. At that point the CTI interface can read the status of the ACI nodes and the internal nodes to support diagnosis of the failure.

Example implementations of BIST engine 412 and CTI interface 414 will become even more apparent to those skilled in the art in accordance with the detailed descriptions of example implementations of the system interface and stream command interpreter provided above, as well as the further descriptions in connection with the ACI block below.

Figure 9:
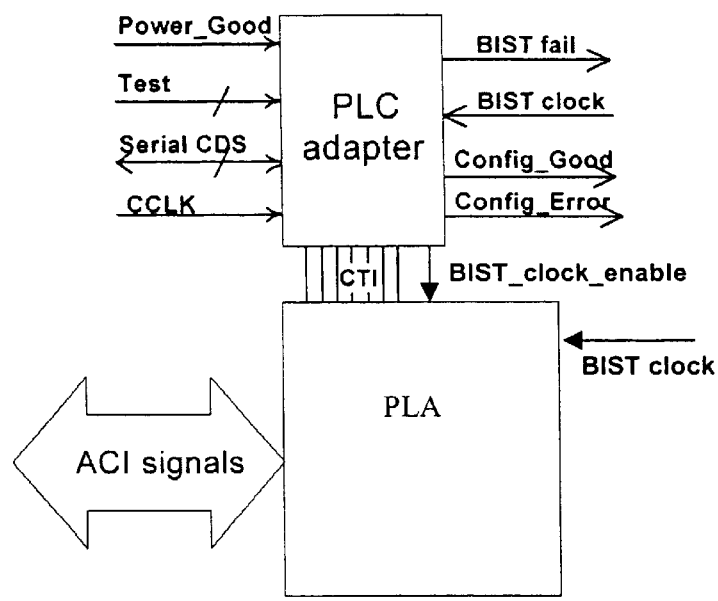
FIG. 9 illustrates interfaces and interconnections of a PLC adapter, PLC core and a ACI signals in accordance with an aspect of the invention.

An example of the simplified interface for a PLC containing a PLC adapter such as that described above and an ACI in accordance with one example implementation of the present invention is shown in FIG. 9. As shown in this example, "ACI signals" include: PLA inputs, PLA outputs, SCLKI and SCLK2, SRSTI and SRST2.

The function of each group of the specific interface signals shown in FIG. 9 is as follows. Power Good: This power-up signal is generated on-chip or off-chip, and indicates that,the power rails are at stable values and that normal logic operations can commence. Test: This group of signals represents the interface for the boundary scan circuitry in the PLC adapter and includes both data and sequential control signals. These signals are normally used for manufacturing component test, but can also be used in some circumstances as a supplementary configuration data source and an interactive (debugger) test interface. A boundary scan controller in the BIST engine initiates the self-test circuits in the PLC adapter and is also used to read the summary test results. BIST_fail: This is a dynamic signal during BIST which goes from low to high at the point where the first BIST error is detected. BIST_clock: This is the clock source for the BIST Engine. As shown in FIG. 9, this clock goes to both the PLC adapter and to the programmable logic army. The BIST_clock_enables are driven by the adapter to the programmable logic array. Using the BIST_clock_enables allows the adapter to control execution of the BIST circuits in the PLC without having to stop the BIST clock.

Serial CDS: This group of signals represents the Configuration Data Source, for a serial ROM interface, the CDS signals can be connected to a set of package pins that are connected in turn to a serial ROM device on a board design, for example. CCLK: This is the configuration clock input to the PLC. The frequency is typically based on the operating frequency of a serial ROM used to program the PLC. Config Good: The PLC adapter generates this signal to indicate that the configuration process is complete and that normal circuit operation can commence. Config Error: This signal is generated to indicate that some type of problem occurred in the process of configuring a PLC. ACI signals: The collection of application specific input, output, clock and reset signals between the application circuitry and a PLC. SCLK and SRST are the application clock and reset signals for execution of a PLC program in a PLC instance. The PLC adapter inhibits the use of these signals until the configuration process is complete. These are part of the ACI bus. CTI: Configuration/Test Interface. This is the interface between the PLC adapter and the programmable logic array. Signals in this interface include configuration address and data, configuration control, ACI scan chains, and BIST control. As discussed above, the data portion of the CTI could be made wider in this implementation (e.g., greater than 128 bits wide) to allow fast access to the configuration memory during write and memory monitoring operations.

Figure 10:
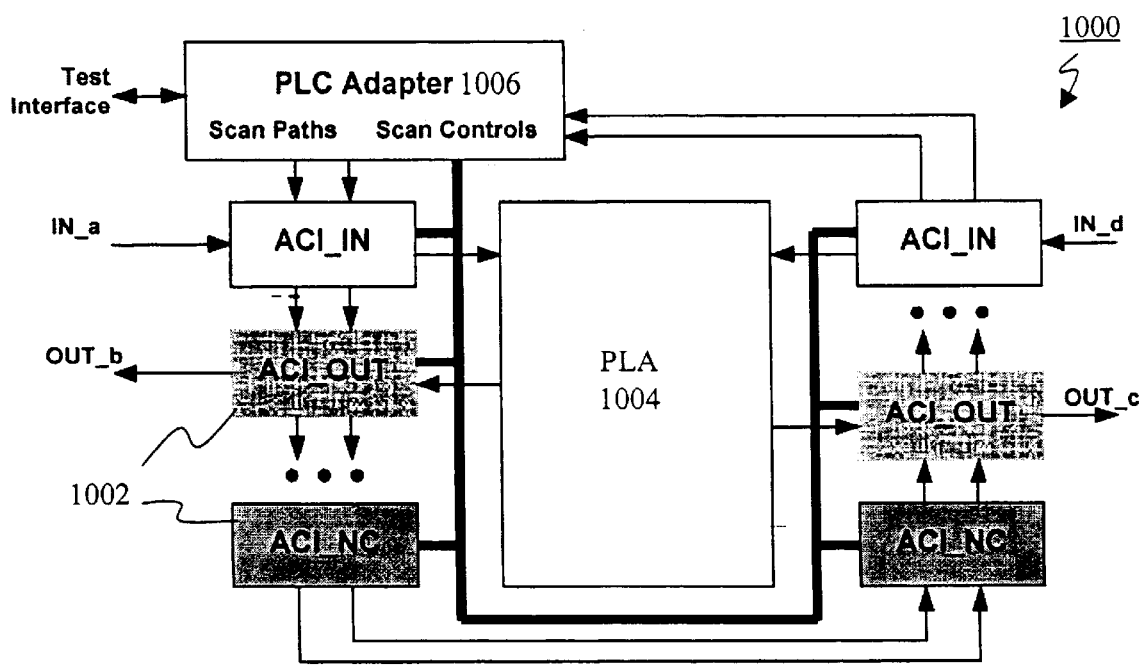
FIG. 10 is a block diagram illustrating the interoperation of a PLC adapter and a PLC core in accordance with the principles of the invention.

FIG. 10 is a functional block diagram illustrating the interoperation of components 1002 of an ACI with a PLC adapter 1004 and a PLA 1006 in a PLC 1000 in accordance with one example implementation of the present invention.

Generally, the Application Circuit Interface (ACI) consists of buffer and test circuitry that provides the interface between the programmable logic array (e.g., an MSA) and the application circuitry, provides isolation of the core programmable logic array from the application circuitry during PLC BIST, provides scan support for manufacturing test of the application circuitry, provides scan support for system circuit debugging and provides scan support for PLC circuit debugging.

In one example implementation, the ACI structure supports two independent scan chains: the Test Chain, used for manufacturing test of the application circuitry; and the Debug Chain, used for core programmable logic array diagnostic and debugging functions. Both scan chains are accessible from the PLC adapter CTI interface circuitry, for example. The test chain can be used to capture and stimulate the application circuit signals, and is used to isolate the programmable logic array from the ASIC signals during configuration and BIST. The debug chain can be used to capture and stimulate signals in the programmable logic array global routing structure independent of the application circuits.

As shown in FIG. 10, each function cell row of the programmable logic array is connected to two ACI components 1002 on both the left and right edges of the array: ACI_IN, which connects an input signal from the application circuitry to the PLA, and ACI_OUT, which connects an output signal from the PLA to the application circuitry. A further ACI component on each side of the array, ACI_NC, which connects to the PLA but does not connect to the application circuitry, provides a continuation of the scan chains and consistent debugging capability. It should be noted that two ACI components are located on each edge of the array in this example. However, this is not necessary. Rather, the number of components per row can be a function of the PLC architecture and acceptable I/0 pin density into the PLC, for example, among the possible design considerations.

In accordance with the example design methodology of the co-pending application, the assignment of PLA 1004 cell type to each ACI location can be specified in the PLC Specification. In addition to the application signal interface, the ACI block can also contain the input buffers and scan registers for the SCLK and SRST inputs to the PLC, which components are referred to herein as ACI_SCLK and ACI_SRST, respectively. As further shown in FIG. 10, the "scan controls" from a boundary scan controller in the PLC adapter 1006 buffer are used to shift the scan path data through each ACI signal buffer and set test values. Each ACI signal buffer includes two storage elements: a boundary scan register bit and an interface line value register bit.

As should be apparent from above, the PLC in one example implementation supports three types of buffers: input (to the core programmable logic), output (from the core programmable logic), and three-state output (from the core programmable logic array with application circuit control).

Figure 11A:
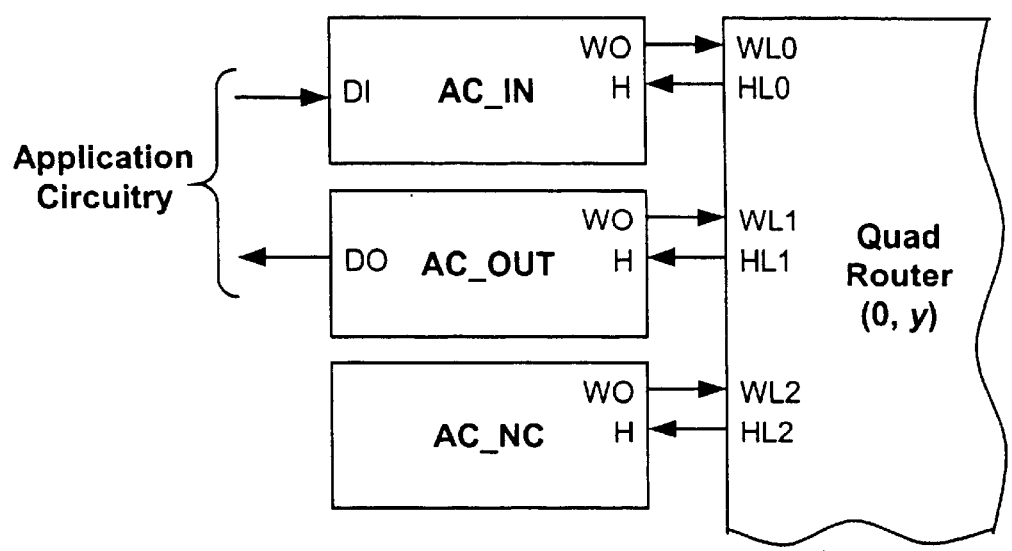
FIGS. 11A and 11B further illustrate an ACI in accordance with an example implementation of the present invention.
Figure 11B:
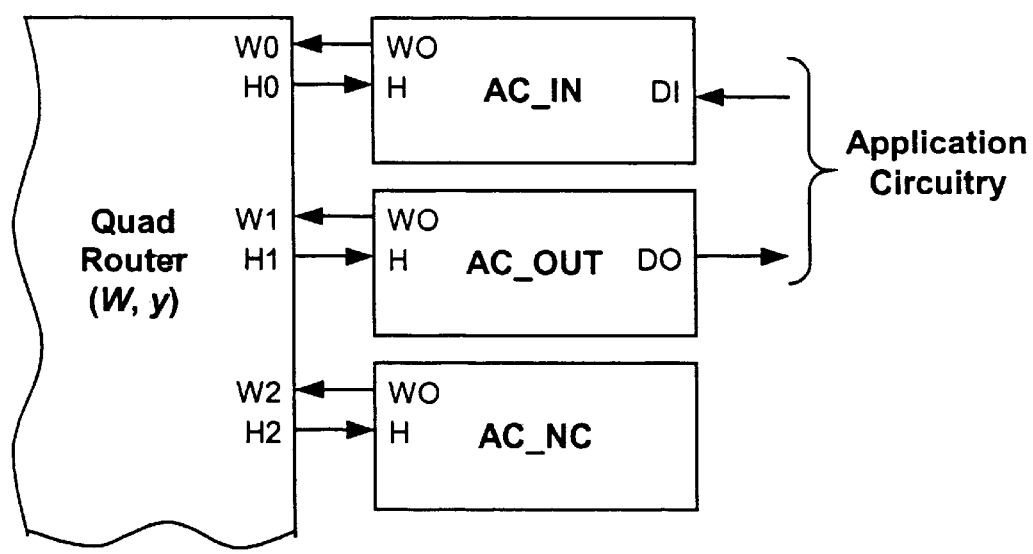

FIGS. 11A and 11B further illustrate the connections of an ACI with the left and right sides of a programmable logic array, respectively, in accordance with an aspect of the invention. It should be noted that, in the descriptions below, the ACI provides a path between the "D" signals of the ASIC (i.e., application circuitry) and the "W" signals of the programmable logic array (including the router circuitry shown in the Figures). Generally, the "H" signals are used for debug and test.

During normal operation the ACI_IN cell connects a signal driven by application circuitry to an input of a horizontal quad router associated with the programmable logic array.

On the left side of the array the ACI cell is connected to the otherwise unused WL input to the quad router. On the right side of the array the ACI cell is connected to the W input to the quad router. In one example, the WL/W input at site 0 of each quad router can be directly connected to the function cell in the first/last column as well as to the quad router. Site 0 therefore may be used to provide a "fast" input path to the array by connecting directly to a function cell input, bypassing the quad router.

The ACI_OUT cell connects a signal driven by the configured programmable logic array to an input buffer in the application circuitry. On the left side of the array the ACI cell is connected to the otherwise unused HL output of the horizontal quad router. On the right side of the array the ACI cell is connected to the H output of the quad router.

During configuration of the core programmable logic array, the application circuit will be isolated from the PLA by the ACI_OUT cell to drive a constant value. This will prevent any transient changes within the PLA to propagate to the application circuitry.

The test scan chain supports manufacturing test of the application circuitry. The test chain is used to capture and update the application circuit side of the ACI, and to provide isolation of the programmable logic array during manufacturing test and BIST operation. The test chain is controlled by the Adapter test interface. The ACI cells may also be used during the PLC Built-In Self Test to force a pattern generated by the BIST engine onto the W inputs of the peripheral horizontal quad routers.

The debug scan chain supports run time debugging of the programmable logic array. The debug chain may be used to capture and update PLA global routing signals accessible through the peripheral horizontal quad routers. The debug chain may be operated independent of the application circuitry. The debug chain is controlled by circuitry in the adapter such as the CTI interface.

Figure 12:
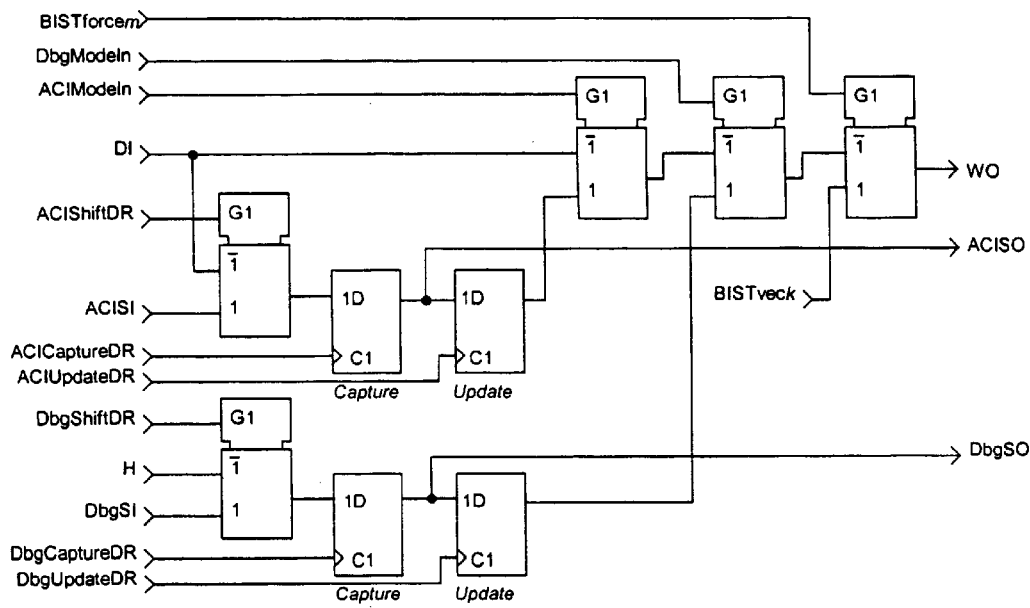
FIG. 12 is a diagram illustrating an input cell of an ACI in accordance with an example implementation of the invention.

An example implementation of an ACI_IN cell such as that shown in FIG. 11 is further illustrated in FIG. 12. As shown in FIG. 12, inputs from the Application Circuitry to the programmable logic array are implemented by the ACI_IN cell.

In one example, the normal operation path is from the DI input to the WO output. During normal operation BISTforcem, DbgModeIn and ACIModeIn are all held off. The CaptureDR and UpdateDR scan control signals are shown as gated clocks, but the implementation may choose to distribute TCK and the TAP Controller state, and implement the Capture and Update registers with enabled register cells. The Update registers are shown as edge-triggered flip flops, but may be implemented as level-sensitive latches enabled during the TCK=0 phase of the Update_DR TAP Controller state.

Figure 13:
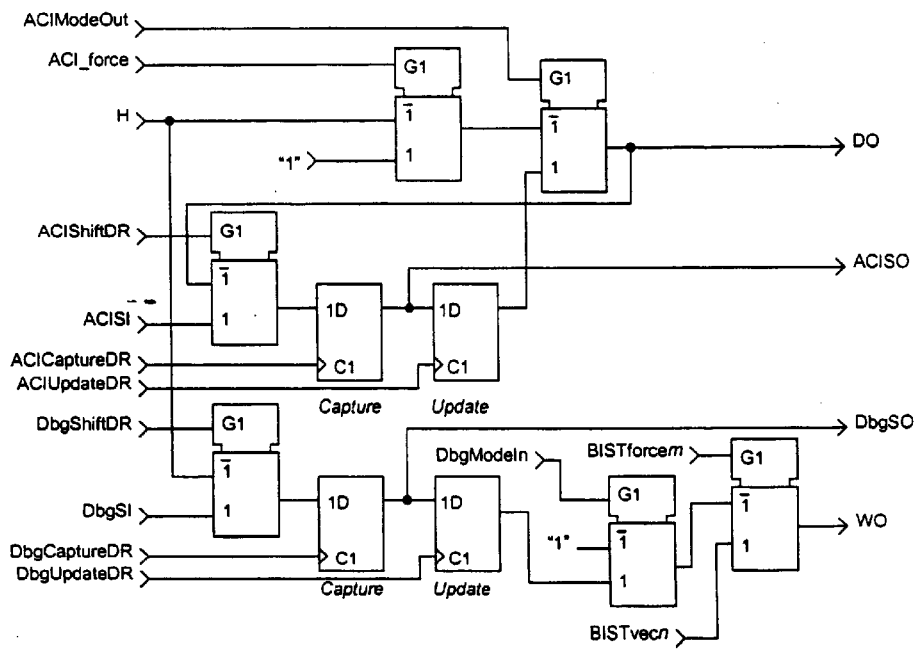
FIG. 13 is a diagram illustrating an output cell of an ACI in accordance with an example implementation of the invention.

An example implementation of an ACI_OUT cell such as that shown in FIG. 11 is further illustrated in FIG. 13. As shown in FIG. 13, outputs from the programmable logic array to the Application Circuitry are implemented by the ACI_OUT cell. In this example, the normal operation path is from the H input to the DO output. During normal operation ACI_force, DbgModeIn, ACIModeOut and BISTforcem are all held off. A constant '1' value will be driven to the WO output of the ACI and thus as an input to the PLA. During configuration it is expected that ACI_force will be asserted to isolate the application circuitry from any transients induced in the PLA. The ACI_OUT cell participates in the Test chain, allowing the capture and update of the DO signal (output to the application circuitry). The ACI_OUT cell participates in the Debug chain, allowing the capture of the H input and the update of the WO output. The Adapter can also force a value from the BISTveck to the WO output using the BISTforcem input. The CaptureDR and UpdateDR scan control signals are shown as gated clocks, but the implementation may choose to distribute TCK and the TAP Controller state, and implement the Capture and Update registers with enabled register cells. The Update registers are shown as edge-triggered flip flops, but may be implemented as level-sensitive latches enabled during the TCK=0 phase of the Update-DR TAP Controller state.

Figure 14:
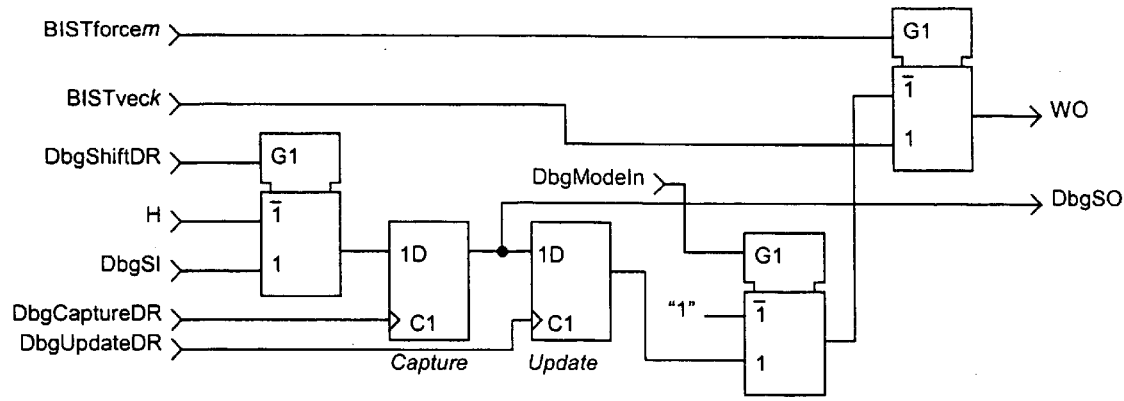
FIG. 14 is a diagram illustrating an ACI_NC cell of an ACI in accordance with an example implementation of the invention.

As further illustrated in FIG. 11, ACI sites which are not specified to be connected to the programmable logic array are populated with the ACI_NC cell. An example implementation of an ACI_NC cell such as that shown in FIG. 11 is further illustrated in FIG. 14.

During normal operation DbgModeIn and BISTforcem are held off, driving a constant '1' on the WO output. The ACI_NC cell participates in the Debug chain, allowing the capture of the H input and the update of the WO output. The ACI_NC cell does not participate in the Test chain, but does pass the Test chain signals through with no clock latency. The CaptureDR and UpdateDR scan control signals are shown as gated clocks, but the implementation may choose to distribute TCK and the TAP Controller state, and implement the Capture and Update registers with enabled register cells. The Update register is shown as an edge-triggered flip flop, but may be implemented as a level-sensitive latch enabled during the TCK=0 phase of the Update-DR TAP Controller state.

Figure 15:
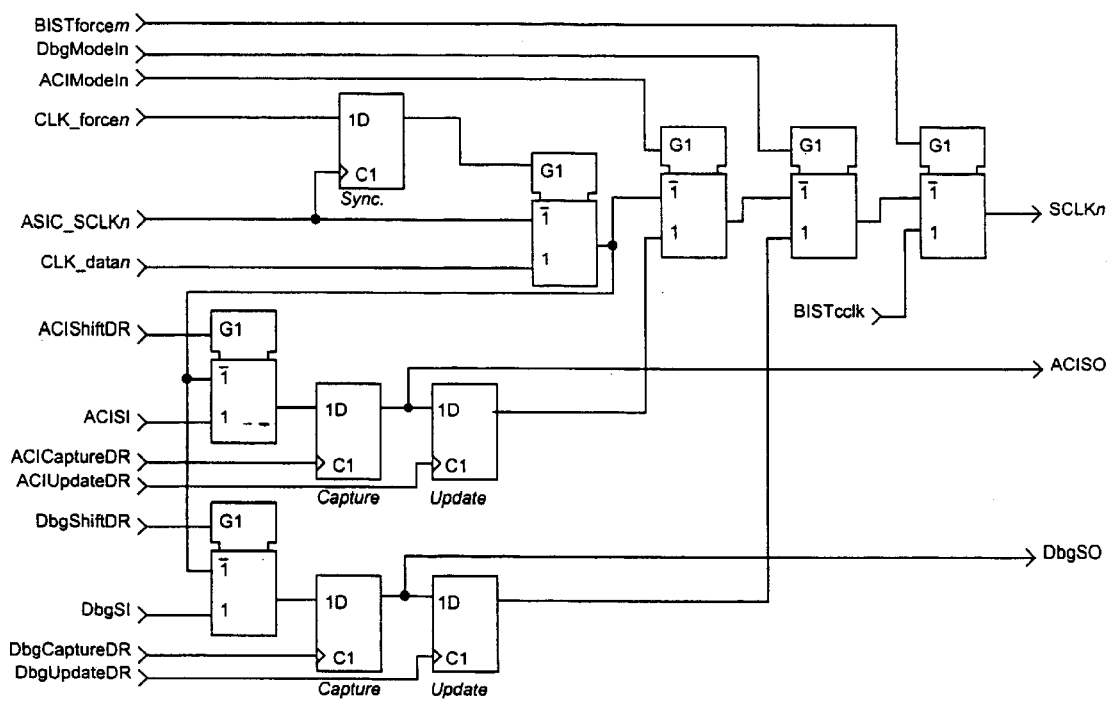
FIG. 15 is a diagram illustrating an ACI_SCLK cell of an ACI in accordance with an example implementation of the invention.

An example implementation of an ACI_SCLK cell such as that shown in FIG. 11 is further illustrated in FIG. 15. Generally, system clock inputs from the application circuitry to the programmable logic array are implemented by the ACI_SCLK cell.

The normal operation path is from the ASIC_SCLKn input from the application circuitry to the SCLKn output to the PLA. During normal operation BISTforceN, DbgModeIn, ACIModeIn and CLK_dataN are held off. The ACI_SCLK cell participates in both the test chain and the debug chain, allowing the capture and update of the SCLKn output. The SCLK output can also be controlled by the PLC Adapter through the use of the CLK_forcem and CLK_datan inputs. When CLK_forcen is driven high by the PLC Adapter, it is synchronized with the ASIC_SCLK signal to select the CLK_datan input as the clock source. CLK_datan may then be driven by the PLC Adapter to generate individual clock edges to SCLK. CLK_datan must be set to '1' before the assertion of CLK_forcen, and set to '0' before the deassertion of CLK_forcem. The CaptureDR and UpdateDR scan control signals are shown as gated clocks, but the implementation may choose to distribute TCK and the TAP Controller state, and implement the Capture and Update registers with enabled register cells. The Update registers are shown as edge-triggered flip flops, but may be implemented as level-sensitive latches enabled during the TCK=0 phase of the UpdateDR TAP Controller state.

Figure 16:
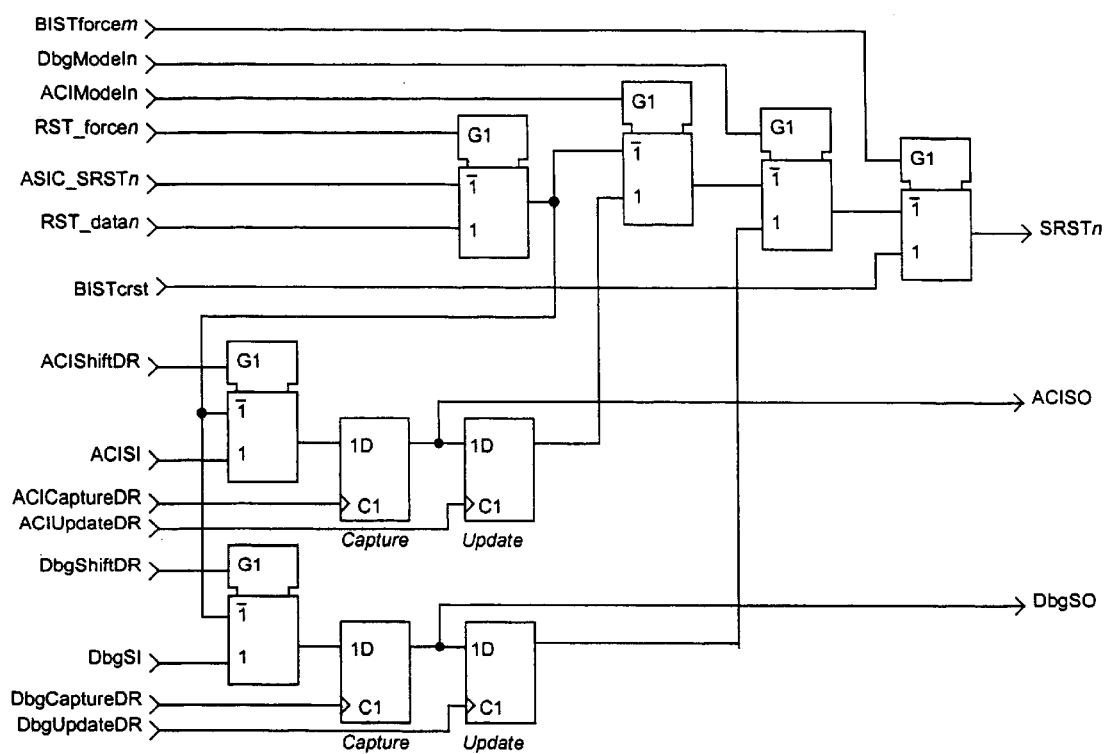
FIG. 16 is a diagram illustrating an ACI_SRST cell of an ACI in accordance with an example implementation of the invention.

An example implementation of an ACI_SRST cell such as that shown in FIG. 11 is further illustrated in FIG. 16. Generally, system reset inputs from the application circuitry to the programmable logic array are implemented by the ACI_SRST cell.

The normal operation path is from the ASIC_SRSTn input from the application circuitry to the SRSTn output to the PLA. During normal operation BISTforceN, DbgModeIn, ACIModeIn and RST_forceN are held off. The ACI_SRST cell participates in both the test chain and the debug chain, allowing the capture and update of the SRSTn output. The CaptureDR and UpdateDR scan control signals are shown as gated clocks, but the implementation may choose to distribute TCK and the TAP Controller state, and implement the Capture and Update registers with enabled register cells. The Update register is shown as an edge-triggered flip flop, but may be implemented as a level-sensitive latch enabled during the TCK=0 phase of the UpdateDR TAP Controller state. The SRST signals from the MSA must always be defined and used. The RST_forcem signal allows the transition from the system reset to a reset source controlled by the adapter interface, RST_data. The system also allows for the return to the System Reset.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims include such changes and modifications.

What is claimed is:

1. A custom integrated circuit, comprising:
   a configuration and test interface for providing configuration data and test control signals and patterns to a programmable logic array embedded within the custom integrated circuit;
   a system interface for communicating with one of a high level processor and a system bus within the custom integrated circuit; and
   an adapter that facilitates communication of data and control between the configuration and test interface and the system interface, wherein the adapter is implemented as a soft macro for facilitating changes for different interfaces and applications without impacting the programmable logic array.

2. A custom integrated circuit, comprising:
   a configuration and test interface for providing configuration data and test control signals and patterns to a programmable logic array embedded within the custom integrated circuit;
   a system interface for communicating with one of a high level processor and a system bus within the custom integrated circuit; and
   an adapter that facilitates communication of data and control between the configuration and test interface and the system interface, wherein the configuration and test interface is variable in width and can be changed for different applications.

3. A custom integrated circuit according to claim 2, wherein the width of the configuration and test interface is variable in accordance with a desired speed of configuring the programmable logic array.

4. A custom integrated circuit according to claim 2, wherein the width of the configuration and test interface is variable in accordance with a desired speed of monitoring a configuration memory of the programmable logic array.

5. A custom integrated circuit, comprising:
   a configuration and test interface for providing configuration data and test control signals and patterns to a programmable logic array embedded within the custom integrated circuit;
   a system interface for communicating with one of a high level processor and a system bus within the custom integrated circuit; and
   an adapter that facilitates communication of data and control between the configuration and test interface and the system interface, wherein the adapter includes a built in self test controller for controlling execution of tests in the programmable logic array.

6. A custom integrated circuit, comprising:
   a configuration and test interface for providing configuration data and test control signals and patterns to a programmable logic array embedded within the custom integrated circuit;

a system interface for communicating with one of a high level processor and a system bus within the custom integrated circuit; and an adapter that facilitates communication of data and control between the configuration and test interface and the system interface, wherein the configuration data is provided to the adapter through the system interface in a configuration data stream, the stream including a unique identifier, the adapter being responsive to the unique identifier for loading the configuration data into the programmable logic array from the configuration data stream.

7. A custom integrated circuit according to claim 6, further comprising one or more other adapters respectively associated with other programmable logic arrays, each of the other adapters being responsive to respective other unique identifiers; in the configuration data stream.

8. A custom integrated circuit according to claim 7, wherein a startup condition of the adapter and the other adapters is synchronized.

9. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit; and an adapter that facilitates communication of data and control between the configuration and test interface and the system interface, wherein the adapter includes an error detection circuit for monitoring efforts errors in the configuration data.

10. A custom integrated circuit according to claim 9, wherein the error detection circuit flags detected errors to a monitoring processor without interruption of the operation of the programmable logic array.

11. A custom integrated circuit according to claim 9, wherein the error detection circuit is adapted to be operative during a first mode of configuring the programmable logic array, a second mode of performing built-in self test, and a third mode of memory monitoring.

12. A custom integrated circuit according to claim 5, wherein the built in self test controller implements a general error detection solution scheme for detecting errors during built in self test of the programmable logic array.

13. A custom integrated circuit according to claim 5, wherein the built in self test controller and the programmable logic array receive the same BIST clock, the built in self test controller generating clock enables to drive the programmable logic array.

14. A custom integrated circuit according to claim 6, wherein the configuration data stream is one of a parallel bit stream and a serial bit stream, the adapter being responsive to the unique identifier in either the parallel bit stream or the serial bit stream.

15. A custom integrated circuit according to claim 9, wherein the configuration data is provided by the system interface in one of a parallel bit stream and a serial bit stream, the error detection circuit being operative to detect configuration data errors in either the parallel bit stream or the serial bit stream.

16. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit; and an adapter that facilitates communication of data and control between the configuration and test interface and the system interface, wherein the adapter provides a connection between boundary I/Os in the programmable logic array and a boundary scan chain in the custom integrated circuit for facilitating the running of Automatic Test Pattern Generated vectors in the overall custom integrated circuit.

17. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit; and an adapter that facilitates communication of data and control between the configuration and test interface and the system interface, wherein the adapter controls the start, stop and single step of the system clock to the programmable logic array, thereby allowing debugging of the programmable logic array.

18. A custom integrated circuit according to claim 17, wherein the adapter further allows the setting of a hardware breakpoint based on a programmable logic condition and the issuing of an interrupt to a monitoring processor.

19. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit; and an adapter that facilitates communication of data and control between the configuration and test interface and the system interface, wherein the adapter receives the configuration data through the system interface from both a configuration data source external to the custom integrated circuit and a processor within the custom integrated circuit.

20. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit;

an adapter that facilitates communication of data and control between the configuration and test interface and the system interface; and a test controller for controlling diagnostics and debugging of the programmable logic array.

21. A custom integrated circuit, comprising:

a configuration and test interface for providing configuration data and test control signals and patterns to a programmable logic array embedded within the custom integrated circuit;

a system interface for communicating with one of a high level processor and a system bus within the custom integrated circuit;

an adapter that facilitates communication of data and control between the configuration and test interface and the system interface; and an application circuit interface that isolates the programmable logic array from other application specific circuitry within the custom integrated circuit.

22. A programmable logic device, comprising:

application circuitry;

a first programmable logic array;

a first application circuit interface that provides signal interface between the programmable logic array and the application circuitry;

a first adapter that initiates and loads configuration data into the programmable logic array; and a second programmable logic array, a second application circuit interface and a second adapter.

23. A programmable logic device according to claim 22, wherein the adapter and the second adapter are responsive to respective unique identifiers for receiving and loading configuration data into the respective programmable logic array and the second programmable logic array.

* * * * *